(12) United States Patent
Sakai et al.

(10) Patent No.: US 6,857,361 B2
(45) Date of Patent: Feb. 22, 2005

(54) METHOD AND APPARATUS FOR PRINTING SOLDER PASTE OF DIFFERENT THICKNESS ON LANDS ON PRINTED CIRCUIT BOARD

(75) Inventors: Hiroshi Sakai, Tokyo (JP); Motoji Suzuki, Tokyo (JP); Makoto Igarashi, Niigata (JP); Akihiro Tanaka, Niigata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/159,474

(22) Filed: May 31, 2002

(65) Prior Publication Data

US 2002/0185020 A1 Dec. 12, 2002

(30) Foreign Application Priority Data

Jun. 1, 2001 (JP) ........................................ 2001-166909

(51) Int. Cl.[7] ................................................ B41N 1/24
(52) U.S. Cl. ........................ 101/129; 101/127; 101/123; 427/96
(58) Field of Search ................................. 174/255, 257, 174/260; 101/127, 123, 124, 126, 128.21, 128.4, 129; 118/213, 406; 427/96, 97, 282

(56) References Cited

U.S. PATENT DOCUMENTS

| | | | | |
|---|---|---|---|---|
| 4,872,261 A | * | 10/1989 | Sanyal et al. | 29/840 |
| 4,919,970 A | * | 4/1990 | Hoebener et al. | 427/96 |
| 5,452,842 A | * | 9/1995 | Melton et al. | 228/180.22 |
| 5,743,007 A | * | 4/1998 | Onishi et al. | 29/840 |
| 5,804,248 A | * | 9/1998 | Hewett | 427/96 |
| 6,096,131 A | | 8/2000 | Hewett | |
| 6,273,327 B1 | * | 8/2001 | Murray et al. | 228/245 |
| 6,316,736 B1 | * | 11/2001 | Jairazbhoy et al. | 174/260 |
| 2002/0179323 A1 | * | 12/2002 | Sakai et al. | 174/255 |
| 2002/0185304 A1 | * | 12/2002 | Sakai et al. | 174/257 |

FOREIGN PATENT DOCUMENTS

| | | | |
|---|---|---|---|
| JP | 61-144396 | * | 7/1986 |
| JP | 2-107487 | * | 4/1990 |
| JP | 4-91861 | * | 3/1992 |
| JP | 04-336490 | * | 11/1992 |
| JP | 05-177965 | * | 7/1993 |
| JP | 06-252152 | * | 9/1994 |
| JP | 6-305272 | | 11/1994 |
| JP | 7-101033 | * | 4/1995 |
| JP | 07-263857 | | 10/1995 |
| JP | 8-192585 | | 7/1996 |
| JP | 10-44369 | | 2/1998 |
| JP | 10-224024 A | * | 8/1998 |
| JP | 11-74638 | | 3/1999 |
| JP | 11-177224 | * | 7/1999 |

OTHER PUBLICATIONS

Partial machine translation of JP 06–252152 from JPO website.*
J.H. Vincent, et al., "Lead–Free Solders for Electronic Assembly", *The GEC Journal of Research*, 11(2), pp. 76–89 (1994).
Korean Office Action, dated Jun. 28, 2004, together with Japanese language and English language translations.

* cited by examiner

*Primary Examiner*—Leslie J. Evanisko
(74) *Attorney, Agent, or Firm*—Scully, Scott, Murphy & Presser

(57) ABSTRACT

A printing mask has protrusions having through holes defined therein for printing a solder paste on lands on a printed circuit board. The protrusions serve to increase the amount of solder paste filled in the through holes.

10 Claims, 5 Drawing Sheets

METHOD AND APPARATUS FOR PRINTING SOLDER PASTE OF DIFFERENT THICKNESS ON LANDS ON PRINTED CIRCUIT BOARD

BACKGROUND OF THE INVENTION

1. Field of the Invention

The present invention relates to a printing mask and a printing method for printing a solder paste on lands on a printed circuit board for mounting various electronic parts thereon, and more particularly to a surface-mounted structural assembly having a printed circuit board with various electronic parts mounted thereon by soldering and a method of manufacturing such a surface-mounted structural assembly.

2. Description of the Related Art

It has heretofore been the customary practice to use soldering to mount electronic parts on a printed circuit board (hereinafter referred to as "PCB"). One example of a process of mounting electronic parts on both surfaces of a PCB by reflow soldering will be described below with reference to FIG. 1 of the accompanying drawings.

In step 101, a solder paste is printed on lands on a surface of a PCB using a printing mask having holes which are defined complementarily to the lands. In step 102, surface-mount components including chip parts, QFPs (Quad Flat Packages), SOPs (Small Outline Packages), etc. are placed on the printed solder paste. Then, in step 103, the PCB with the surface-mount components placed thereon is passed through a high-temperature reflow furnace to melt the solder paste, thus soldering the leads of the surface-mount components to the lands on the PCB. After the surface-mount components have thus been mounted on one surface of the PCB, the PCB is inverted in step 104, so that the other surface of the PCB faces upwardly.

In steps 105, 106, a solder paste is applied to and surface-mount components are placed on the other surface of the PCB in the same manner as with steps 101, 102. Thereafter, leads of electronic parts (hereinafter referred to as "through-hole parts") to be mounted in through holes in the PCB are inserted into the through holes in the PCB in step 107, thus placing the through-hole parts on the PCB. The PCB is then passed through the reflow furnace to melt the solder paste, thus soldering the through-hole parts to the PCB in step 108 in the same manner as with step 103.

Finally, any components which cannot withstand the high temperature in the reflow furnace are manually soldered to the PCB in step 109, thus completing the mounting of necessary electronic parts on the PCB.

In the conventional process of mounting electronic parts on a PCB, there has generally been used an Sn—Pb solder as the solder paste. However, since the Sn—Pb solder contains Pb that is a toxic heavy metal, it tends to adversely affect the environment if electronic devices including those PCBs are not properly processed after use. For this reason, there has recently been a demand for the use of Pb-free solder materials on PCBs to prevent environmental pollution.

Sn—Ag solder has widely been known as Pb-free solder. Since the properties of Ag are stable, the Sn—Ag solder is as reliable as the Sn—Pb solder when used to mount electronic parts on PCBs. One problem of the Sn—Ag solder is that the melting point of the Sn—Ag solder is about 220° C. that is higher than the melting point of the Sn—Pb solder which is about 183° C. Therefore, it is difficult to directly use surface-mounting facilities and processes that have used the Sn—Pb solder to solder electronic parts with the Sn—Ag solder. Specifically, because general electronic parts have a heat resistance temperature of about 230° C., if the Sn—Ag solder is melted in the reflow furnace to solder the electronic parts, then the temperature of the electronic parts may possibly reach 240° C. or higher. Consequently, if electronic parts are to be mounted on PCBs with the Sn—Ag solder, then it is necessary to increase the heat resistance temperature of those electronic parts.

Another type of Pb-free solder is Sn—Zn solder. Since the Sn—Zn solder has a melting point of about 197° C., the conventional surface-mounting facilities and electronic parts can directly be used if the Sn—Zn solder is applied to solder the electronic parts.

However, the Sn—Zn solder is disadvantageous as compared with the Sn—Pb solder in that Zn is easily oxidizable and makes wetting poor. If electronic parts are mounted on PCBs with the Sn—Zn solder using the conventional surface-mounting facilities and processes, the Sn—Zn solder is not as reliable as the Sn—Pb solder.

The above paste printing process will be described below with reference to FIGS. 1 and 2A through 2C of the accompanying drawings. An interconnection pattern of copper foil has been covered with an insulating resist layer on a PCB, and lands are provided on the PCB by removing the resist layer from portions of the interconnection pattern. The resist layer is omitted from illustration in FIGS. 2A, 2B, and 2C.

As shown in FIG. 2A, printing mask 111 is positioned on PCB 112 with through holes 116 defined therein being aligned with respective lands 115 on PCB 112. Then, a given amount of solder paste 113 is placed on printing mask 111 on PCB 112. As shown in FIG. 2B, solder paste 113 is turned and moved over printing mask 111 from one end to the other by squeegee 118.

As solder paste 113 is turned and moved over printing mask 111, it is pushed into through holes 116 by squeegee 118 and filled in through holes 116. As shown in FIG. 2C, when printing mask 111 is peeled off PCB 112, a given layer of solder paste 113 is printed on each land 115 on PCB 112. Now, the solder paste printing process is completed.

Use of the Sn—Zn solder in the process of printing the solder paste on the PCB and performing reflow soldering poses the following problems: When the solder paste is filled in the through holes in the PCB and through-hole parts are mounted thereon, since the Sn—Zn solder has poor wettability, if the Sn—Zn solder is applied in the same amount as the conventional Sn—Pb, then solder fillets around the leads of the through-hole parts may be small or no solder fillets may be formed around the leads of the through-hole parts on the surface of the PCB opposite to the surface of the PCB that is printed with the solder paste. Therefore, the through-hole parts may not be well connected to the lands.

In view of the above problems, it has been proposed to increase the opening areas of the through holes in the printing mask in order to increase the amount of solder paste filled in the through holes and the amount of flux for thereby increasing wettability with the leads and the through holes. However, because the through holes for insertion of the leads of the through-hole parts are defined in adjacent positions in the PCB, if the printing mask with the increased opening areas of the through holes is used, then the applied solder paste is liable to extend between the leads passing through the adjacent through holes.

Therefore, if the printing mask with the increased opening areas of the through holes is used, then a solder bridge may be formed between the leads of the through-hole parts mounted on the PCB, and the solder paste flowing from between the leads may be turned into a number of balls (solder balls).

SUMMARY OF THE INVENTION

It is therefore an object of the present invention to provide a printing mask and a printing method which make it possible to increase the applied amount of a solder paste printed on any lands on a PCB without causing the applied solder paste to extend between the lands.

Another object of the present invention is to provide a surface-mounted structural assembly in which electronic parts are reliably joined to lands on a PCB by a solder paste without causing the applied solder paste to extend between the lands, and a method of manufacturing such a surface-mounted structural assembly.

According to the present invention, a printing mask has a plurality of through holes for printing a solder paste on lands on a printed circuit board and at least one protrusion, at least one of the through holes being defined in the protrusion.

Since the protrusion increases the depth of the through hole defined therein, a layer of solder paste filled in the through hole has an increased thickness. Therefore, the amount of the applied solder paste printed on the lands is increased without increasing the opening area of the through hole. The amount of the applied solder paste printed on any desired land on the printed circuit board can thus be increased reliably without producing a solder bridge or solder balls. The increased amount of the applied solder paste increases solder wettability with respect to through holes and leads in particular, allowing leads passing through the through holes to be joined reliably.

The printing mask is used to print a solder paste on a printed circuit board which has a first land for placing a lead of an electronic part thereon and a second land including a through hole for passing a lead of the electronic part therethrough. Therefore, only the second land including the through hole for passing the lead of the electronic part therethrough should preferably be formed on the protrusion. As a result, since the depth of the through hole corresponding to the second land is greater than the depth of the through hole corresponding to the first land, the amount of the applied solder paste printed on the second land is greater than the amount of the applied solder paste printed on the first land.

In the printing mask, the solder paste preferably comprises an Sn—Zn alloy which is relatively poor in wettability.

According to the present invention, a method of printing a solder paste prints a solder plate on lands on a printed circuit using the above printing mask.

According to the present invention, there is also provided a surface-mounted structural assembly comprising an electronic part mounted, by soldering, on a printed circuit board having a first land for placing a lead of an electronic part thereon and a second land including a through hole for passing a lead of the electronic part therethrough. Since a layer of solder paste printed on the second land is thicker than a layer of solder paste printed on the first land, the electronic part can reliably be joined to the second land.

According to the present invention, there is provided a method of manufacturing a surface-mounted structural assembly having an electronic part mounted on a printed circuit board by soldering, comprising the steps of printing a solder paste on a printed circuit board using the printing mask according to the present invention, placing an electronic part on the printed circuit board, and joining the electronic part to the printed circuit board with the solder paste. The method makes it possible to manufacture a surface-mounted structural assembly comprising an electronic part mounted, by soldering, on a printed circuit board having a first land for placing a lead of an electronic part thereon and a second land including a through hole for passing a lead of the electronic part therethrough. In the printing step, since the printing mask is used, a layer of solder paste printed on the second land is thicker than a layer of solder paste printed on the first land. Therefore, the electronic part can reliably be joined to the second land.

The above and other objects, features, and advantages of the present invention will become apparent from the following description with reference to the accompanying drawings which illustrate an example of the present invention.

DESCRIPTION OF THE PREFERRED EMBODIMENT

Figure 1:
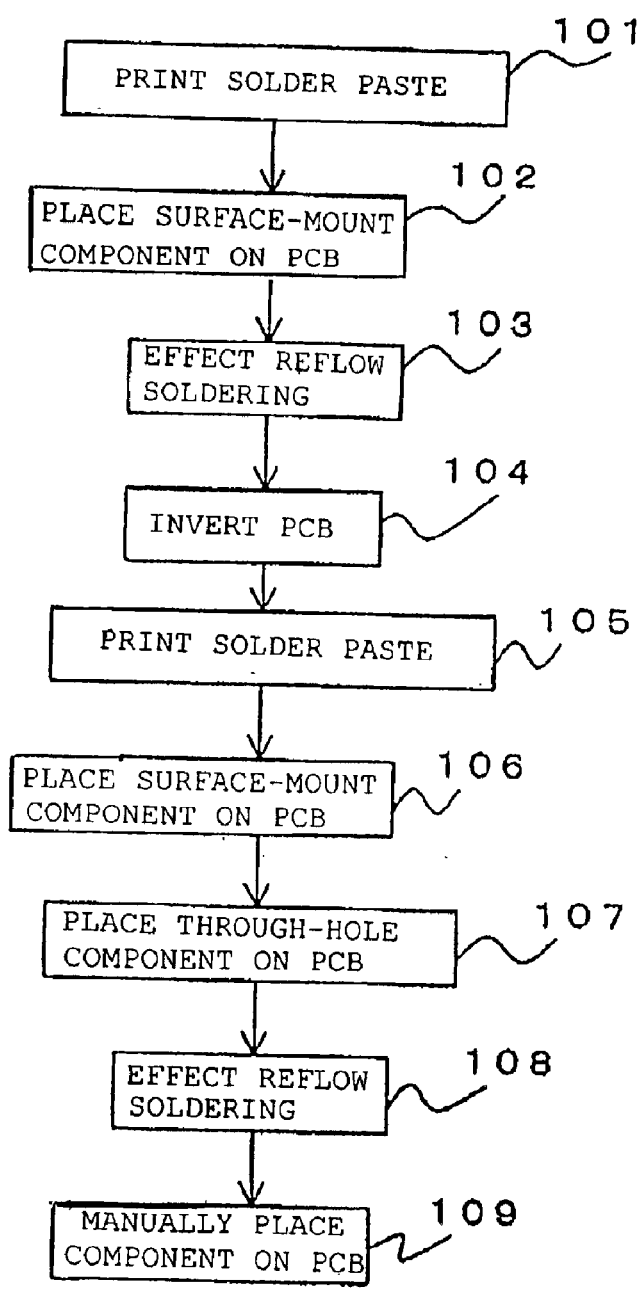
FIG. 1 is a flowchart of a conventional process of mounting electronic parts on a PCB with solder.
Figure 2A:
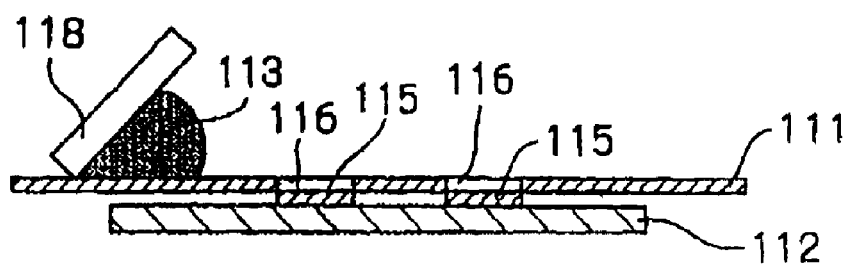
FIG. 2A is a cross-sectional view showing a printing mask placed on a PCB with through holes positioned in alignment with lands on the PCB in a conventional solder paste printing process.
Figure 2B:
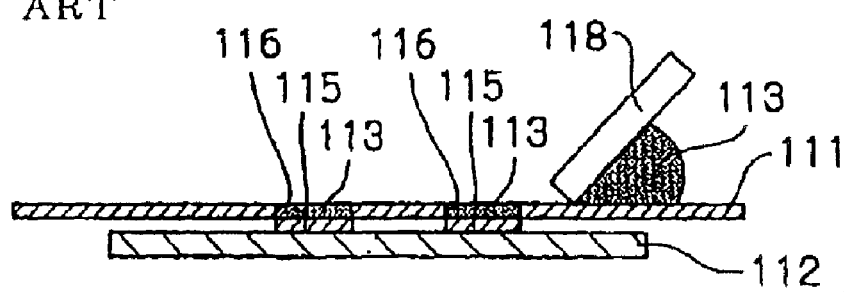
FIG. 2B is a cross-sectional view showing a solder paste filled in the through holes in the printing mask in the conventional solder paste printing process.
Figure 2C:
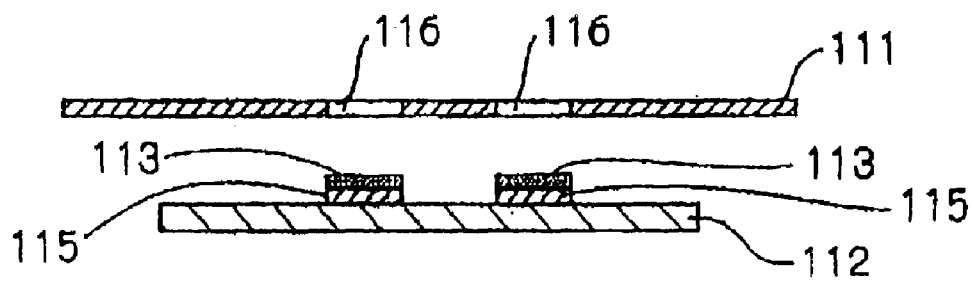
FIG. 2C is a cross-sectional view showing the solder paste printed on the lands on the PCB in the conventional solder paste printing process.
Figure 3:
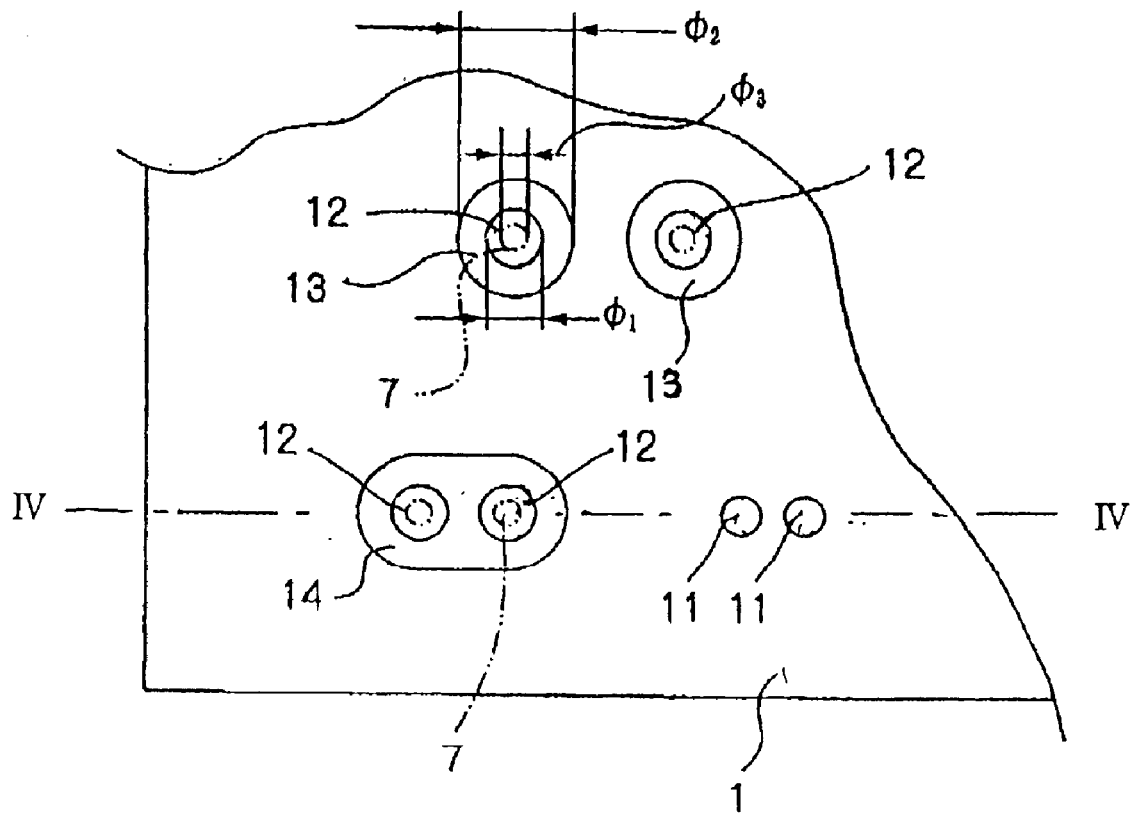
FIG. 3 is a fragmentary plan view of a printing mask according to an embodiment of the present invention.
Figure 4:
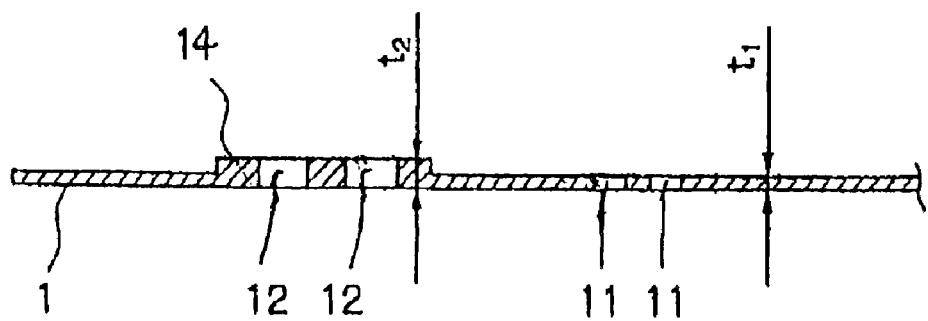
FIG. 4 is a cross-sectional view taken along line IV–IV of FIG. 3.

PCB 2 (see FIGS. 5A, 5B, 5C and 6) which will be printed with a solder paste using printing mask 1 according to an embodiment of the present invention as shown in FIGS. 3 and 4 has a plurality of first lands 5 for mounting surface-mount electronic parts and a plurality of second lands 6 for mounting through-hole parts whose leads are inserted in through holes in the PCB, first and second lands 5, 6 being located in predetermined positions. Second lands 6 extend between one surface of PCB 2 and the other surface of PCB 2, with through holes 7 defined respectively therein.

As shown in FIGS. 3 and 4, printing mask 1 comprises a thin sheet of metal such as stainless steel or the like. Printing mask 1 has a plurality of first through holes 11 defined therein which correspond to first lands 5 on PCB 2 and a plurality of second through holes 12 defined therein which correspond to second lands 6 on PCB 2. First through holes 11 have a shape and an area which are substantially equal to the shape and area of first lands 5, and second through holes 12 have a shape which is substantially equal to the shape of second lands 6, and an area which is slightly larger than the area of second lands 6, about 0.1 mm through 0.2 mm greater than the outer circumferential edge of second lands 6.

Printing mask 1 has annular protrusions 13, 14 integral with masking regions around second through holes 12. Annular protrusions 13, 14 are made thicker than other masking regions of printing mask 1 by a plating process or the like.

In the present embodiment, printing mask 1 has a thickness $t_1$ of about 0.15 mm, and annular protrusions 13, 14 have a thickness $t_2$ ranging from 0.18 mm to 0.2 mm. Annular protrusions 13, 14 have an inside diameter $\phi_1$ of about 1.5 mm and an outside diameter $\phi_2$ of about 2.0 mm. Through holes defined in PCB 2 have a diameter $\phi_3$ of about 0.8 mm, and second lands 6 have an outside diameter of about 1.2 mm which is slightly smaller than the inside diameter $\phi_1$ of annular protrusions 13, 14.

With annular protrusions 13, 14 on printing mask 1, printing mask 1 has a thickness near second through holes 12 which is greater than the thickness of printing mask 1 near first through holes 11 in the other mask regions.

A process of printing solder paste 3 on first and second lands 5, 6 on PCB 2 using printing mask 1 will be described below with reference to FIGS. 5A, 5B, and 5C.

Solder paste 3 comprises, for example, an Sn—Zn alloy such as Sn—8Zn—3Bi. PCB 2 has an interconnection pattern of copper foil covered with an insulating resist layer. First and second lands 5, 6 are provided on the PCB by removing the resist layer from portions of the interconnection pattern. The resist layer is omitted from illustration in FIGS. 5A, 5B, and 5C.

Figure 5A:
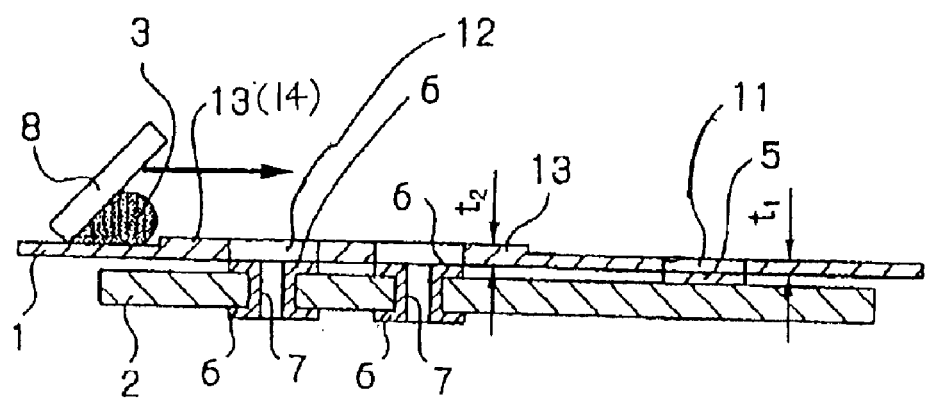
FIG. 5A is a cross-sectional view showing a printing mask placed on a PCB with through holes positioned in alignment with lands on the PCB in a solder paste printing process using the printing mask.
Figure 5B:
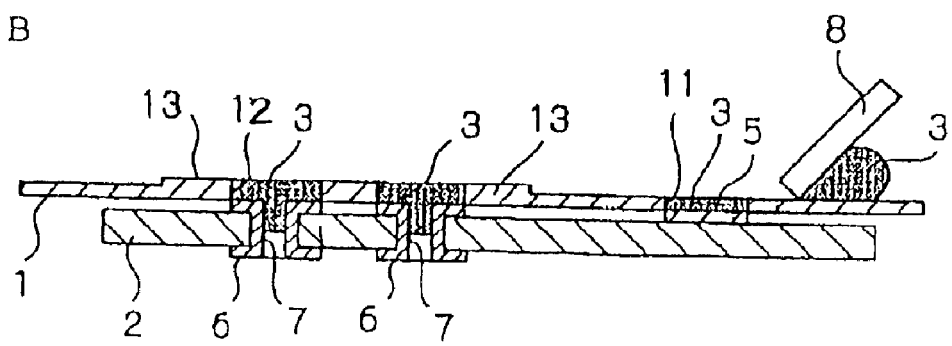
FIG. 5B is a cross-sectional view showing a solder paste filled in the through holes in the printing mask in the solder paste printing process.

As shown in FIG. 5A, printing mask 1 is positioned on PCB 2 with first and second through holes 11, 12 being aligned with respective first and second lands 5, 6 on PCB 2. Then, a given amount of solder paste 3 is placed on printing mask 1 on PCB 2. As shown in FIG. 5B, solder paste 3 is turned and moved over printing mask 1 from one end to the other by squeegee 8.

As solder paste 3 is turned and moved over printing mask 1, it is pushed into first and second through holes 11, 12 by squeegee 8 and filled in first and second through holes 11, 12. Since second through holes 12 are deeper than first through holes 11, the solder paste 3 applied in a quantity depending on the depth of second through holes 12 is placed on second lands 6 on PCB 2 and filled in through holes 7 in PCB 2.

Figure 5C:
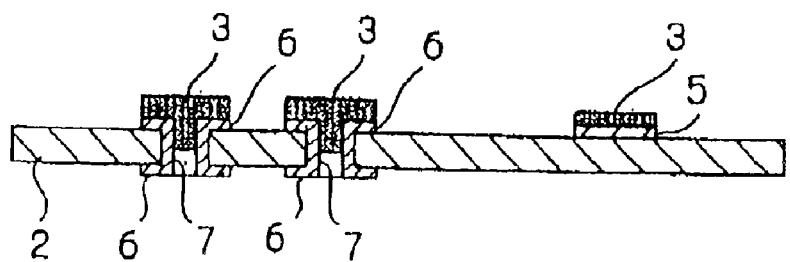
FIG. 5C is a cross-sectional view showing the solder paste printed on the lands on the PCB in the solder paste printing process.

Then, as shown in FIG. 5C, printing mask 1 is peeled off PCB 2, leaving a given layer of solder paste 3 printed on each of first and second lands 5, 6 on PCB 2. Now, the solder paste printing process is completed. The layers of solder paste 3 printed on second lands 6 are thicker than the layers of solder paste 3 printed on first lands 5.

Figure 6:
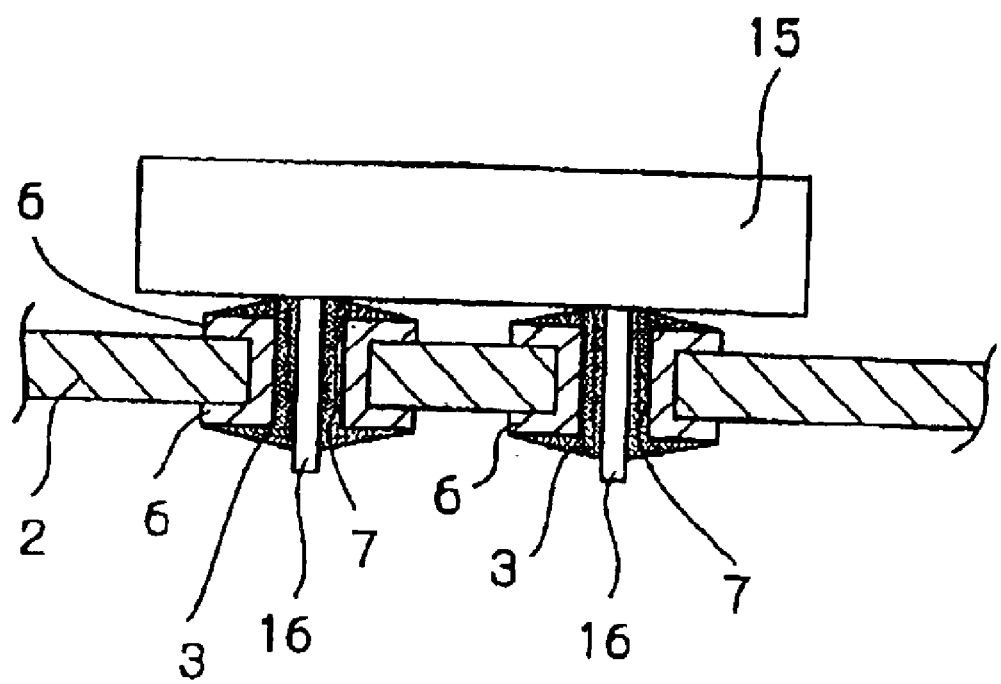
FIG. 6 is a cross-sectional view showing a through-hole part mounted on second lands on a PCB.

When leads 16 of a through-hole part 15 shown in FIG. 6 are inserted into through holes 7 filled with solder paste 3 from one side of PCB 2, leads 16 push filled solder paste 3 out of through holes 7 onto second lands 6 on the other side of PCB 2, thus placing a sufficient amount of solder paste 3 on second lands 6. Since the increased amount of solder paste 3 is supplied to second lands 6, its wettability with respect to leads 16 and through holes 7 is increased. Therefore, when through-hole part 15 placed on PCB 2 is joined by reflow soldering, through-hole part 15 is connected to second lands 6 with sufficient bonding strength.

Printing mask 1 is capable of allowing solder paste 3 to be applied in an increased quantity to second lands 6 and through holes 7 without causing the problem of reduced distances between printed layers of solder paste 3 on adjacent second lands 6, which would otherwise result from an increase in the opening area of second through holes 12.

Therefore, as shown in FIG. 6, through-hole part 15 joined to second lands 6 is well mounted on PCB by solder paste 3 without causing solder paste 3 to extend, as a solder bridge, between leads 16 on adjacent second lands 6 on the surface of PCB 2 where through-hole part 15 is mounted, i.e., where leads 16 are inserted, and also without causing solder paste 3 to flow from second lands 6 and to be turned into solder balls.

Printing mask 1 and the printing process described above are applied to the printing of solder paste 3 to mount through-hole part 15 on one surface of PCB 2 after various surface-mount electronic parts have been mounted on the other surface of PCB 2. However, printing mask 1 and the printing process may be applied, if necessary, to the printing of the solder paste to mount other electronic parts than through-hole parts.

While a preferred embodiment of the present invention has been described using specific terms, such description is for illustrative purposes only, and it is to be understood that changes and variations may be made without departing from the spirit or scope of the following claims.

What is claimed is:

1. A printing mask having a plurality of through holes for printing a solder paste on a first land and on a second land on a printed circuit board and a protrusion, at least one of said through holes being defined in said protrusion, the protrusion corresponding to said second land, the protrusion having a height ranging from about 0.03 mm to about 0.05 mm, the area of said at least one through hole in said protrusion being larger than the area of said corresponding second land, said at least one through hole being about 0.1 mm to 0.2 mm distant from the outer circumferential edge of said second land.

2. The printing mask according to claim 1, wherein said corresponding protrusion which has said through hole is formed only at a location in alignment with one of said lands, said land having a through hole for passage of a lead of an electronic part.

3. A method of printing a solder paste, comprising the steps of:

positioning on a printed circuit board a printing mask having a plurality of through holes for printing a solder paste on a first land and on a second land on said printed circuit board and a protrusion, the protrusion corresponding to said second land, with at least one of said through holes being defined in said protrusion, the protrusion having a height ranging from about 0.03 mm to about 0.05 mm, the area of said at least one through hole in said protrusion being larger than the area of the corresponding second land, said at least one through hole being about 0.1 mm to 0.2 mm distant from the outer circumferential edge of said second land;

placing a solder paste on said printing mask, and printing said solder paste on first and second lands of said lands, such that a layer of solder paste printed on said second land is about 0.03 mm to about 0.05 mm thicker than a layer of solder paste printed on said first land.

4. The method of printing a solder paste according to claim 3, wherein said solder paste comprises an Sn—Zn alloy.

5. A surface-mounted structural assembly comprising:
   a printed circuit board having a first land for placing a lead of an electronic part thereon and a second land including a through hole for passing a lead of the electronic part therethrough;
   an electronic part mounted on said printed circuit board; and
   a solder paste printed on said first land and said second land; wherein
   said electronic part is joined to said printed circuit board by said solder paste such that a layer of solder paste printed on said second land is 0.03 mm to about 0.05 mm thicker than a layer of solder paste printed on said first land, and
   the diameter of said solder paste printed on said second land is about 0.1 mm to 0.2 mm distant from the outer circumferential edge of said second land.

6. The surface-mounted structural assembly according to claim 5, wherein said solder paste comprises an Sn—Zn alloy.

7. A method of manufacturing a surface-mounted structural assembly having an electronic part mounted on a printed circuit board by soldering, comprising the steps of:
   providing a printing mask having a plurality of through holes for printing a solder paste on a first land and on a second land on the printed circuit board and a protrusion, the protrusion corresponding to said second land, at least one of said through holes being defined in said protrusion, the protrusion having a height ranging from about 0.03 mm to about 0.05 mm, the area of said at least one through hole in said protrusion being larger than the area of the corresponding land of said second land, said at least one through hole being about 0.1 mm to 0.2 mm distant from the outer circumferential edge of said second land; and
   printing a solder paste on said printed circuit board using said printing mask.

8. The method according to claim 7, wherein said solder paste comprises an Sn—Zn alloy.

9. A method of manufacturing a surface-mounted structural assembly having electronic parts mounted on a printed circuit board by soldering, comprising the steps of:
   printing a solder paste on said printed circuit board having a first land for placing a first lead of the electronic part thereon and a second land including a through hole for passing a second lead of the electronic part therethrough;
   mounting said electronic part on said printed circuit board after said printing step; and
   joining said electronic part through the solder paste to said printed circuit board;
   characterized in that in the step of printing, a layer of solder paste printed on said second land is thicker than a layer of solder paste printed on said first land; and that in the step of mounting, said second lead of said electronic part is passed through said through hole from a printing side so as to push out said solder paste on the back opposite the printing side,
   wherein in the step of printing the solder paste on said printed circuit board, using a printing mask having a plurality of through holes for printing the solder paste on said first and second lands and at least one protrusion, at least one of said through holes of said mask being defined in said protrusion, said at least one through hole of said mask having an area which is larger than the area of said second land, said at least one through hole of said mask being about 0.1 mm through 0.2 mm distant from the outer circumferential edge of said second land, and the height of the protrusion is 0.03 mm through about 0.05 mm.

10. The method according to claim 9, wherein the solder paste enters in said through hole in said printing step.

* * * * *